(12) United States Patent
Shen

(10) Patent No.: US 8,193,457 B2
(45) Date of Patent: Jun. 5, 2012

(54) STACK STRUCTURE OF CIRCUIT BOARD

(75) Inventor: Hsin-Hung Shen, Taipei (TW)

(73) Assignee: Compal Electronics, Inc., Taipei (TW)

( * ) Notice: Subject to any disclaimer, the term of this patent is extended or adjusted under 35 U.S.C. 154(b) by 200 days.

(21) Appl. No.: 12/641,328

(22) Filed: Dec. 18, 2009

(65) Prior Publication Data

US 2011/0056741 A1 Mar. 10, 2011

(30) Foreign Application Priority Data

Sep. 8, 2009 (TW) .............................. 98130285 A

(51) Int. Cl.
*H01R 13/73* (2006.01)

(52) U.S. Cl. ........ 174/261; 174/255; 174/260; 361/735; 361/736; 361/748; 361/790; 257/686; 257/690; 257/778

(58) Field of Classification Search .......... 174/254–267, 174/138 G, 138 D; 361/729–737, 760–767, 361/780–785, 790–794; 257/700, 723, 724, 257/729, 690, 691, 678, 686, 685, 777, 778; 438/106–113, 600–622; 29/825–852
See application file for complete search history.

(56) References Cited

U.S. PATENT DOCUMENTS

| 6,994,586 | B2 * | 2/2006 | Kanehira | 439/564 |
| 7,554,187 | B2 * | 6/2009 | Kamiya | 257/690 |
| 2002/0125558 | A1 * | 9/2002 | Akram et al. | 257/686 |
| 2007/0080468 | A1 * | 4/2007 | Kamiya | 257/778 |

FOREIGN PATENT DOCUMENTS

| JP | 2001-094002 | | 4/2001 |
| JP | 02004176741 A | * | 6/2004 |
| JP | 2004-221581 | | 8/2004 |
| TW | M264729 | | 5/2005 |
| TW | M292874 | | 6/2006 |
| TW | I272042 | | 1/2007 |

OTHER PUBLICATIONS

"Office Action of Taiwan Counterpart Application", issued on Mar. 28, 2012, p1-p6, in which the listed references were cited.

* cited by examiner

*Primary Examiner* — Michail V Datskovskiy
(74) *Attorney, Agent, or Firm* — Jianq Chyun IP Office

(57) ABSTRACT

A stack structure of a circuit board includes a first substrate, a second substrate and a fixing element. The first substrate has a first component area, a plurality of supporting solder elements, and a plurality of signal solder elements, wherein the plurality of signal elements is disposed in the first component area. The first substrate stacks on the second substrate. The plurality of supporting solder elements is disposed between the first and the second substrates for providing a supporting force. The fixing element secures the first substrate and the second substrate, and the supporting solder elements are disposed around the fixing element.

17 Claims, 2 Drawing Sheets

STACK STRUCTURE OF CIRCUIT BOARD

CROSS-REFERENCE TO RELATED APPLICATION

This application claims the priority benefit of Taiwan application ser. no. 98130285, filed on Sep. 8, 2009. The entirety of the above-mentioned patent application is hereby incorporated by reference herein and made a part of specification.

BACKGROUND OF THE INVENTION

1. Field of the Invention

The present application generally relates to a circuit board, in particular, to a circuit bard having supporting solder elements and a stack structure thereof.

2. Description of Related Art

With the increase of the numbers of electronic devices, the size of a circuit board must increase accordingly to provide more spaces for containing the electronic devices. However, when the size of the circuit board is increased, a product size and design will be effected simultaneously. To solve this question, a serial of circuit board stack structures is developed consequently.

The circuit stack structure includes a first substrate, a second substrate and a plurality of separating pillars. The separating pillars secure between the first and second substrates. However, when an operator screws the separating pillars using a screwdriver, the circuit board will be peeled off or generates tin crack at soldering point. Therefore, how to adopt better protection means to decrease the damage of the circuit board is a key point to be solved and developed in the present application.

SUMMARY OF THE INVENTION

Accordingly, the present application is directed to a stack structure of a circuit board for enhancing the reliability of assembly.

The present application is directed to a stack structure of a circuit board includes a first substrate, a second substrate and a fixing element. The first substrate has a first component area, a plurality of supporting solder elements, and a plurality of signal solder elements, wherein the plurality of signal elements is disposed in the first component area, and the first substrate stacks on the second substrate. The plurality of supporting solder elements is disposed between the first and the second substrates for providing a supporting force. The fixing element secures the first substrate and the second substrate, and the supporting solder elements are disposed around the fixing element.

The present application is directed to a circuit board including a substrate, a plurality of supporting solder elements and a fixing element. The substrate has a fixing portion. The supporting solder elements are disposed around the fixing portion. The fixing element passes through the fixing portion.

According to an embodiment of the present application, the first substrate has a first fixing portion. The fixing element passes through the first fixing portion to make the first substrate stack on the second substrate. The first fixing portion has a screw hole or a penetrating hole.

According to an embodiment of the present application, the fixing element is a screw, a rivet, or a screw pillar.

According to an embodiment of the present application, the first fixing portion is disposed adjacent to the first component area. The supporting solder elements are disposed around the first fixing portion.

According to an embodiment of the present application, a height of the supporting solder elements is larger than that of the signal solder elements.

According to an embodiment of the present application, an arranged density of the supporting solder elements is higher than that of the signal solder elements.

According to an embodiment of the present application, the supporting solder elements are solder balls, solder columns or solder bumps.

Based on the above, a plurality of supporting solder elements are disposed between the first substrate and the second substrate in the present application. When the fixing element secures the first substrate and the second substrate, the supporting solder element provides a supporting force. Hence, the damage of the circuit board is prevented to enhance the reliability of assembly.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

Figure 1A:
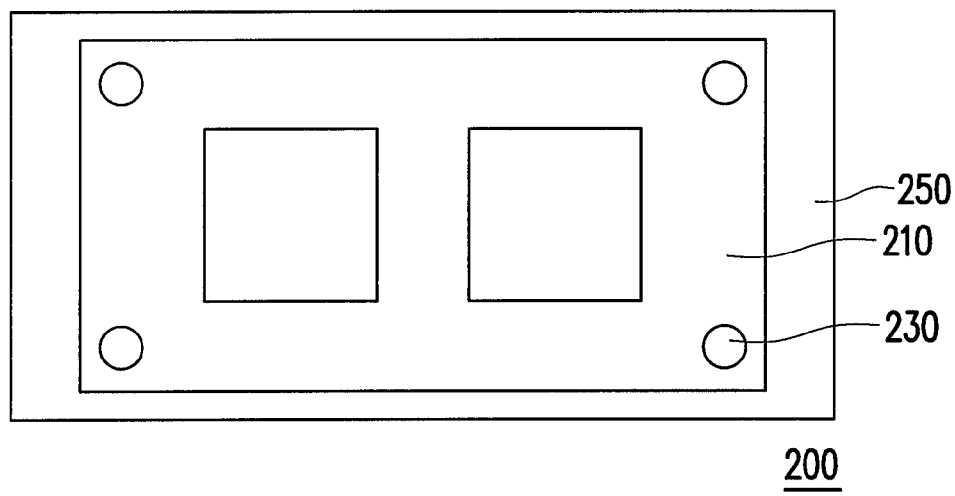
FIG. 1A is a top view of a stack structure of a circuit board according to an embodiment of the present application.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
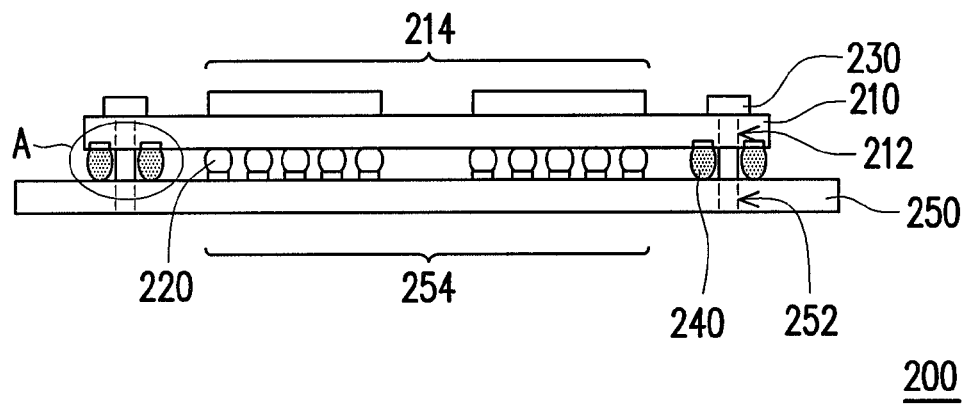
FIG. 1B is a side view of a stack structure of a circuit board according to an embodiment of the present application.

FIGS. 1A and 1B are a top view and a side view of a stack structure of a circuit board according to an embodiment of the present application. The stack structure of the circuit board 200 includes a first substrate 210, a second substrate 250 and a fixing element 230. The first substrate 210 has a plurality of supporting elements 240 and a first fixing portion 212 (for example, screw hole or penetrating hole) where the fixing element 230 (for example, a screw, a rivet or a screw pillar) can pass through. The second substrate 250 has a second fixing portion 252 (for example, a screw or a penetrating hole) where the fixing element 230 can pass through. Hence, the first substrate 210 stacks on the top of the second substrate 250 via the fixing portion 230 passing through the first fixing portion 212 and the second fixing portion 252 to firmly secure the first substrate 210 on the second substrate 250.

As mentioned above, a plurality of supporting solder elements 240 is disposed between the first substrate 210 and the second substrate 250 in the embodiment to prevent the first substrate 210 and the second substrate 250 from damage in assembly operation. The supporting solder elements 240 are, for example, solder balls, solder columns, or solder bumps disposed around the first fixing portion 212. However, the difference between the common solder elements 220 for transmitting signals and the supporting solder elements 240 lies in that the supporting solder elements 240 have no electrically transmitting function, merely as supporting element for construction.

Figure 1C:
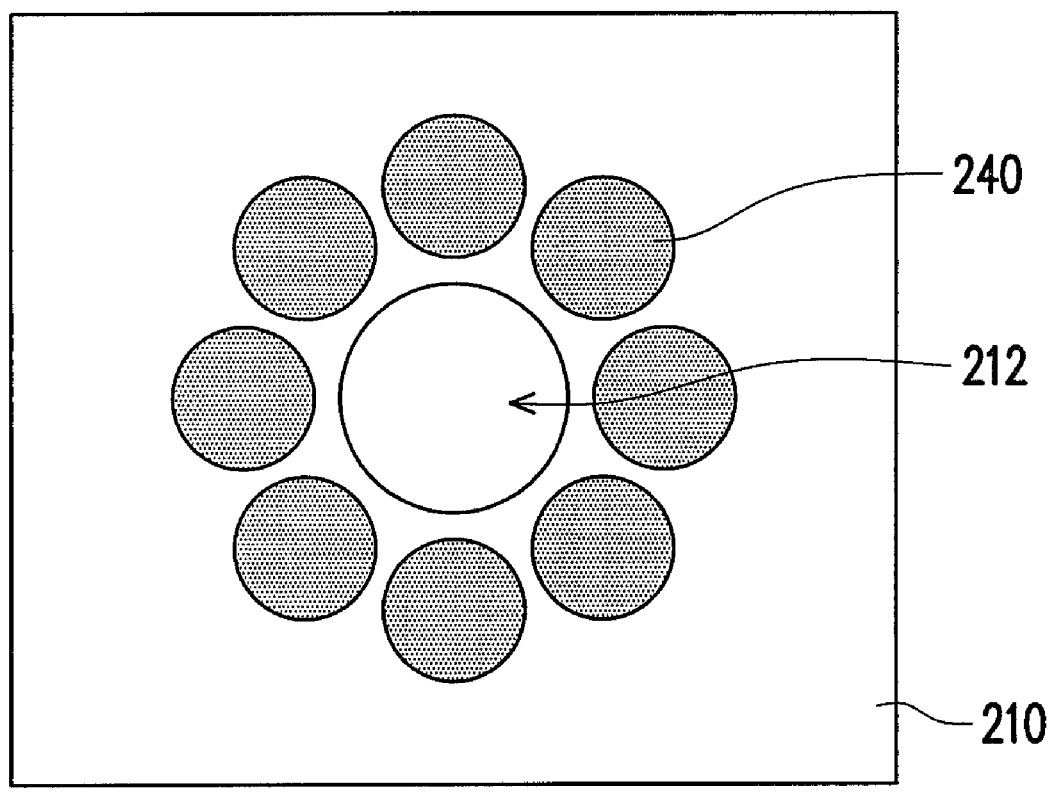
FIG. 1C is an enlarged view of supporting solder elements shown in FIG. 1B.

The supporting solder elements 240 are disposed around the fixing portion 212, for example, arranged as a coil structure around the first fixing portion 212 as shown in FIG. 1C. In addition, the first substrate 210 has a first component area 214, and the first component area 214 has a plurality of signal solder elements 220 thereon for electrically connecting to the first substrate 210 and the second substrate 250. The first component area 214 further has one or more electronic devices disposed thereon, such as a memory or a processor. In the embodiment, four fixing portions 212 can be disposed adjacent to the first component area 214. The second substrate 250 has a second component area 254, and four second fixing portion 252 can be disposed adjacent to the second component area 254 so that the positions of the first fixing portion 212 and the second fixing portion 252 are aligned to each other. Moreover, each of four fixing elements 230 can pass through the first fixing portion 212 and the second fixing portion 252 and secure therebetween.

In the stack structure, the first substrate 210 secures to the second substrate 250 by the supporting solder elements 240 to prevent the two substrates from tin crack at solder point due to the solder strength is not enough to support the external force or copper foil stripped due to peeling between the copper foil and the base material of the printed circuit board. In the embodiment, the solder materials are reflowed to be the supporting solder elements 240 before assembling to the second substrate 250. In addition, in another embodiment, the supporting solder elements 240 also can be disposed on the first substrate. The supporting solder elements can be made of other material, and the shape of the supporting solder elements 240 is not limited to ball.

As shown in FIG. 1C, which is a bottom view of an enlarged area of FIG. 1B. The supporting solder elements 240 are arranged as a coil structure around the first fixing portion 212, the number, height and size of the supporting solder elements 240 can be determined according to actual demand. For example, a height of the supporting solder elements 240 can be larger than that of the signal solder elements 220. An arranged density of the supporting solder elements 240 can be higher than that of the signal solder elements 220. Of course, a height of the supporting solder elements 240 also can be equal to that of the signal solder elements 220, and an arranged density of the supporting solder elements 240 also can be equal to or lower than that of the signal solder elements 220. It is not limited herein.

In summary, a plurality of supporting solder elements is disposed between the first substrate and the second substrate in the present application. When the fixing element secures the first substrate and the second substrate, the supporting solder element provides a supporting force. Hence, the damage of the circuit board is prevented to enhance the reliability of assembly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stack structure of a circuit board, comprising:
   a first substrate, having a first component area, a plurality of supporting solder elements, and a plurality of signal solder elements, wherein the plurality of signal elements is disposed in the first component area;
   a second substrate on which the first substrate stacks, and the plurality of supporting solder elements is disposed between the first and the second substrates for providing a supporting force; and
   a fixing element, fixing the first substrate and the second substrate, and the supporting solder elements are disposed around the fixing element.

2. The stack structure of the circuit board according to claim 1, wherein the supporting solder elements are arranged as a coil structure.

3. The stack structure of the circuit board according to claim 1, wherein the first substrate has a first fixing portion, the fixing element passes through the first fixing portion to make the first substrate stack on the second substrate.

4. The stack structure of the circuit board according to claim 3, wherein the first fixing portion has a screw hole or a penetrating hole.

5. The stack structure of the circuit board according to claim 1, wherein the fixing element is a screw, a rivet, or a screw pillar.

6. The stack structure of the circuit board according to claim 3, wherein the first fixing portion is disposed adjacent to the first component area.

7. The stack structure of the circuit board according to claim 3, wherein the supporting solder elements are disposed around the first fixing portion.

8. The stack structure of the circuit board according to claim 1, wherein a height of the supporting solder elements is larger than that of the signal solder elements.

9. The stack structure of the circuit board according to claim 1, wherein an arranged density of the supporting solder elements is higher than that of the signal solder elements.

10. The stack structure of the circuit board according to claim 1, wherein the supporting solder elements are solder balls, solder columns or solder bumps.

11. A circuit board, comprising:
    a substrate, having a fixing portion and a component area, wherein a fixing element could be fixed on the fixed portion, and the component area has a plurality of signal solder elements thereon; and
    a plurality of supporting solder elements, disposed around the fixing portion, a height of the supporting solder elements is larger than that of the signal solder elements.

12. The circuit board according to claim 11, wherein the fixing portion has a screw hole or a penetrating hole.

13. The circuit board according to claim 11, wherein the fixing element is a screw, a rivet, or a screw pillar.

14. The circuit board according to claim 11, wherein the fixing portion is disposed adjacent to the component area.

15. The circuit board according to claim 11, wherein an arranged density of the supporting solder elements is higher than that of the signal solder elements.

16. The circuit board according to claim 11, wherein the supporting solder elements are solder balls, solder columns or solder bumps.

17. The circuit board according to claim 11, wherein the supporting solder elements are arranged as a coil structure.

* * * * *